United States Patent
Kwon et al.

(10) Patent No.: US 9,047,802 B2
(45) Date of Patent: Jun. 2, 2015

(54) ORGANIC LIGHT EMITTING DISPLAY DEVICE AND TESTING METHOD THEREOF

(71) Applicant: Samsung Display Co., Ltd., Yongin, Gyeonggi-Do (KR)

(72) Inventors: Tae-Hoon Kwon, Yongin (KR); Ji-Hyun Ka, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 82 days.

(21) Appl. No.: 13/769,962

(22) Filed: Feb. 19, 2013

(65) Prior Publication Data

US 2014/0111407 A1   Apr. 24, 2014

(30) Foreign Application Priority Data

Oct. 22, 2012 (KR) .................. 10-2012-0117537

(51) Int. Cl.
- *G09G 3/32* (2006.01)
- *G09G 3/00* (2006.01)
- *H01L 27/32* (2006.01)

(52) U.S. Cl.
CPC .............. *G09G 3/006* (2013.01); *G09G 3/3208* (2013.01); *H01L 27/3244* (2013.01)

(58) Field of Classification Search
USPC ........... 345/76, 77, 78, 204, 214, 211, 82–84, 345/55, 36, 45, 90; 324/762.07, 762.01, 324/760.01, 760.02, 403; 315/169.1, 169.3, 315/167, 160, 168, 337, 334, 169.4
See application file for complete search history.

(56) References Cited

U.S. PATENT DOCUMENTS

| | | | |
|---|---|---|---|
| 8,742,784 B2 * | 6/2014 | Kim et al. | 324/760.01 |
| 2007/0080905 A1 * | 4/2007 | Takahara | 345/76 |
| 2008/0054798 A1 * | 3/2008 | Jeong et al. | 313/504 |
| 2011/0080173 A1 * | 4/2011 | Kim et al. | 324/403 |
| 2011/0234654 A1 | 9/2011 | Park et al. | |
| 2012/0032995 A1 | 2/2012 | Lee | |

FOREIGN PATENT DOCUMENTS

| | | |
|---|---|---|
| KR | 10-2003-0054936 A | 7/2003 |
| KR | 10-2007-0087845 B1 | 4/2007 |
| KR | 10-0712179 B1 | 4/2007 |
| KR | 10-0732819 B1 | 6/2007 |
| KR | 10-2008-0039676 A | 5/2008 |
| KR | 10-2011-0066145 A | 6/2011 |
| KR | 10-2012-0013602 A | 2/2012 |

* cited by examiner

*Primary Examiner* — Olga Merkoulova
(74) *Attorney, Agent, or Firm* — Robert E. Bushnell, Esq.

(57) ABSTRACT

An organic light emitting display device and a testing method thereof for detecting a failure occurring in a cutting process of a protective film attached to an upper end of a panel. The organic light emitting display device includes a first substrate on which a pixel unit and a tester are formed. The pixel unit includes a plurality of pixels positioned at intersection portions of scan lines and data lines, and the tester includes a plurality of transistors coupled to the respective data lines so as to supply test signals to the data lines. The transistors are divided into at least two groups, so that transistors of one group are turned on/off by a first test control line, and transistors of another group are turned on/off by a second test control line, the first and second test control lines being disposed on opposite sides of the substrate.

10 Claims, 2 Drawing Sheets

ORGANIC LIGHT EMITTING DISPLAY DEVICE AND TESTING METHOD THEREOF

CLAIM OF PRIORITY

This application makes reference to, incorporates the same herein, and claims all benefits accruing under 35 U.S.C. §119 from an application earlier filed in the Korean Intellectual Property Office on the 22 Oct. 2012 and there duly assigned Serial No. 10-2012-0117537.

BACKGROUND OF THE INVENTION

1. Field of the Invention

An aspect of the present invention relates to an organic light emitting display device and a testing method thereof, and more particularly, to an organic light emitting display device and a testing method thereof, which can detect even a failure occurring in a cutting process of a protective film attached to the upper end of a panel.

2. Description of the Related Art

Recently, there have been developed various types of flat panel display devices capable of reducing the weight and volume of cathode ray tubes, which are disadvantages. The flat panel display devices include, but are not limited to, a liquid crystal display device, a field emission display device, a plasma display panel, an organic light emitting display device.

Among these flat panel display devices, the organic light emitting display device displays images using organic light emitting diodes that emit light through recombination of electrons and holes. The organic light emitting display device has a fast response speed and is driven with low power consumption.

An organic light emitting display device using a self-luminescent element does not use a separate light source such as a backlight, and is advantageous in light weight. Simultaneously, it is suitable to implement a flexible display device.

An organic material that is a key component of the organic light emitting display device is damaged by reacting with water, oxygen, etc., when being exposed to the air. Hence, in the organic light emitting display device, an encapsulation for sealing the upper portion of a panel using glass, film, etc., is essential in the organic light emitting display device.

However, in order to implement a flexible organic light emitting display device, an encapsulation substrate is preferably formed of flexible material, as well as a lower substrate on which pixels are formed. Accordingly, the flexible organic light emitting display device has recently been manufactured by performing a thin film encapsulation using a thin film.

Under the current situation in which a touch method is widely applied as the input method of various types of display devices, the organic material can be more effectively protected from external stimulus by attaching a protective film on the upper portion of a thin-film encapsulated panel. In this case, a cutting process of the protective film should be performed so that a pad portion or IC mounting region of the panel can be exposed, but an element, wire, etc. positioned beneath the protective film may be damaged even in the cutting process of the protective film. Accordingly, it is required to develop an organic light emitting display device and a testing method thereof, which can detect even a failure occurring in the cutting process of the protective film.

SUMMARY OF THE INVENTION

Embodiments provide an organic light emitting display device and a testing method thereof, which can detect even a failure occurring in a cutting process of a protective film attached to the upper end of a panel.

According to an aspect of the present invention, there is provided an organic light emitting display device, including a first substrate on which a pixel unit and a tester are formed, wherein the pixel unit includes a plurality of pixels positioned at intersection portions of scan lines and data lines, and the tester includes a plurality of transistors coupled to the respective data lines so as to supply a test signal to the data lines, and wherein the transistors are divided into at least two groups, so that transistors of one group are turned on/off by a first test control line disposed via a first side of the first substrate, and transistors of another group are turned on/off by a second test control line disposed via a second side opposite to the first side of the first substrate.

The organic light emitting display device may further include an encapsulation substrate that encapsulates one region of the first substrate including at least the pixel unit; and a protective film attached to the upper portion of the encapsulation substrate.

The first substrate, the encapsulation substrate and the protective film may be formed of a flexible material.

A pad portion coupled to an external driving circuit may be provided at one side of the first substrate, and the encapsulation substrate and the protective film may expose the one side of the first substrate including the pad portion.

The pixels may include unit pixels each having a plurality of sub-pixels, and the unit pixels may be divided into first and second pixel groups. Gate electrodes of transistors coupled to the unit pixels of the first pixel group among the plurality of transistors may be coupled to the first test control line, and gate electrodes of transistors coupled to the unit pixels of the second pixel group among the plurality of transistors may be coupled to the second test control line.

The unit pixels of the first pixel group may be set as unit pixels on an odd-numbered column, and the unit pixels of the second pixel group may be set as unit pixels on an even-numbered column.

The first test control line may be coupled to the pad portion of the first substrate via a non-pixel region at the left side of the pixel unit, and the second test control line may be coupled to the pad portion of the first substrate via a non-pixel region at the right side of the pixel unit.

Each transistor may be coupled between any one of a plurality of test signal lines and any one of the data lines.

The test signal lines may include a first test signal line for supplying a red test signal to the data lines, a second test signal line for supplying a green test signal to the data lines, and a third test signal line for supplying a blue test signal to the data lines.

According to an aspect of the present invention, there is provided a testing method for detecting a failure of an organic light emitting display device by supplying a test signal to a plurality of transistors coupled to each data line, wherein the transistors are divided into at least two groups, and transistors of each group are turned on by respectively supplying test control signals to different test control lines disposed via different sides of the organic light emitting display device.

Pixels may be divided into at least two groups, and pixels of each group may emit light by turning on the transistors of the at least two groups at different times.

As described above, according to the present invention, the organic light emitting display device includes a test having a plurality of transistors coupled to each data line so as to supplying a test signal to the data lines. The transistors are divided into at least two groups, and the transistors of each group are turned on/off by first or second test control lines disposed via different sides of the panel. The transistors are driven by respectively supplying first and second test control signals to the first and second test control lines after a cutting process of a protective film, so that it is possible to detect even a failure occurring in the cutting process of the protective film.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1:
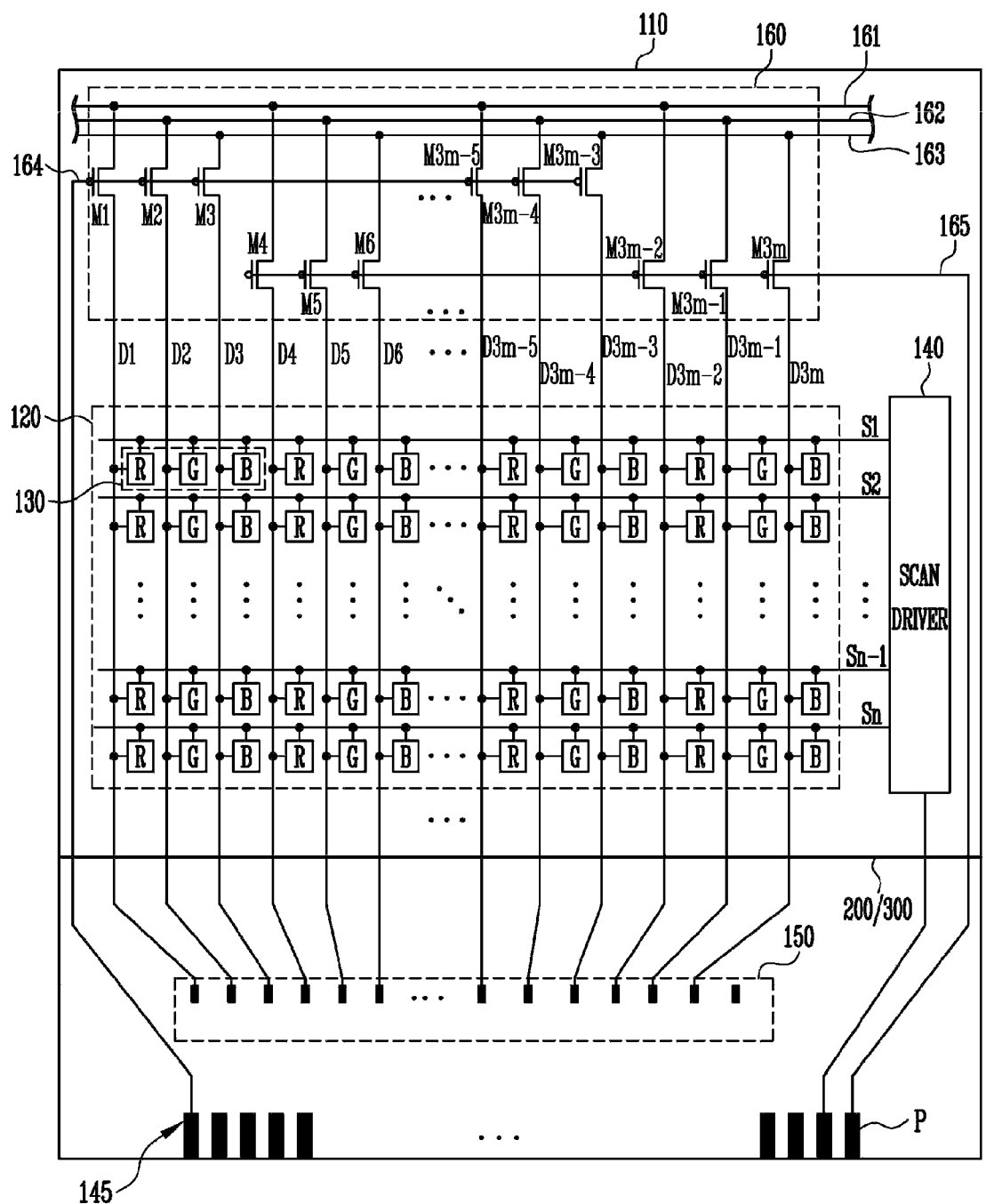
FIG. 1 is a plan view schematically illustrating a panel of an organic light emitting display device according to an embodiment of the present invention.

Hereinafter, certain exemplary embodiments according to the present invention will be described with reference to the accompanying drawings. Here, when a first element is described as being coupled to a second element, the first element may be not only directly coupled to the second element but may also be indirectly coupled to the second element via a third element. Further, some of the elements that are not essential to the complete understanding of the invention are omitted for clarity. Also, like reference numerals refer to like elements throughout.

Figure 2:
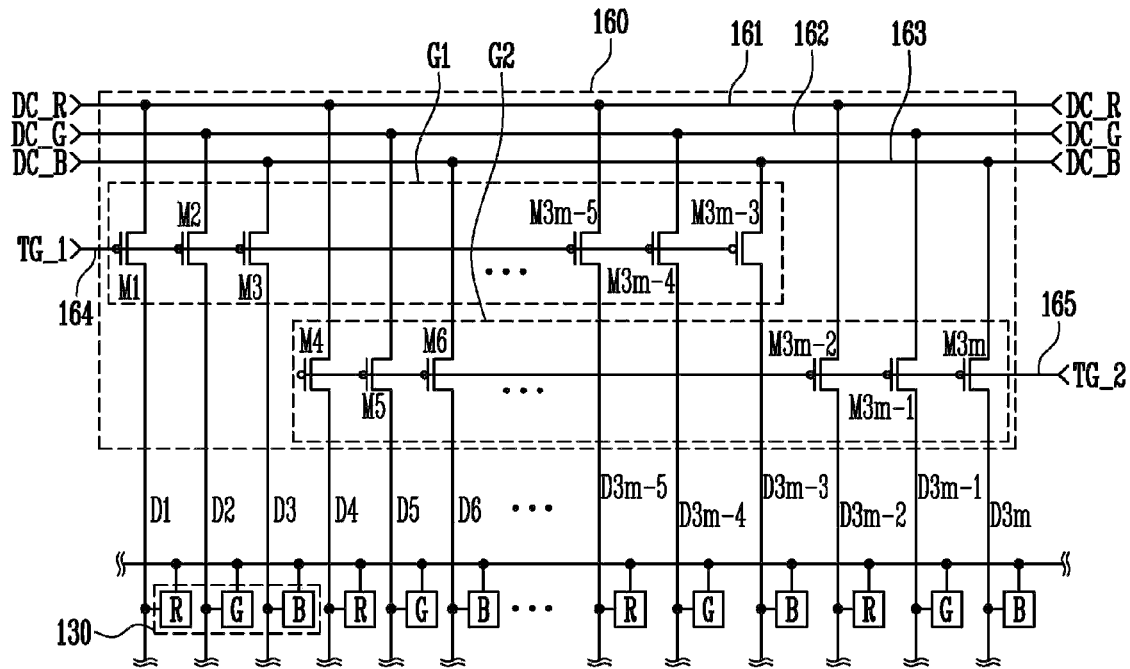
FIG. 2 is a main-part enlarged view illustrating a tester shown in FIG. 1 and a testing method using the tester.

FIG. 1 is a plan view schematically illustrating a panel of an organic light emitting display device according to an embodiment of the present invention. FIG. 2 is a main-part enlarged view illustrating a tester shown in FIG. 1 and a testing method using the tester.

Referring to FIG. 1, the panel of the organic light emitting display device includes a first substrate (e.g., a lower substrate) 110 on which a pixel unit 120, a scan driver 140, a tester 160, a pad portion 145, an IC mounting region 150, an encapsulation substrate 200 disposed to overlap with one region of the first substrate 110, and a protective film 300.

The first substrate 110 is a substrate on which at least the pixel unit 120 is formed, and may be formed of various materials such as glass and film. However, in a case where a flexible display device is implemented, the first substrate 110 may be formed of a flexible material such as a flexible film.

The pixel unit 120 includes a plurality of pixels 130 positioned at intersection portions of scan lines S1 to Sn and data lines D1 to D3m. Here, the plurality of pixels 130 may each have a plurality of sub-pixels (e.g., R, G and B sub-pixels). When a scan signal is supplied from the scan driver 140 via scan lines S1 to Sn, the pixels emit light, corresponding to a test signal or a data signal supplied from the data lines D1 to D3m.

The scan driver 140 includes shift registers (not shown), which are coupled to the scan lines S1 to Sn. The scan driver 140 sequentially supplies a scan signal to the scan lines S1 to Sn.

The tester 160 includes a plurality of transistors M1 to M3m coupled between one side of each of the data lines D1 to D3m and any one of a plurality of test signal lines 161, 162 and 163. Each of the transistors M1 to M3m is turned on when a test control signal is supplied to a control electrode, i.e., a gate electrode thereof, so as to supply a test signal from the test signal lines 161, 162 and 163 to the data lines D1 to D3m.

In the present invention, the transistors M1 to M3m are divided into at least two groups, so that the turn-on/off of the transistors of the at least two groups are controlled by different test control lines. For example, the turn-on/off of transistors of one group among the transistors M1 to M3m may be controlled by a test control signal supplied from a first test control line 164 disposed via a first side (e.g., a non-pixel region at the left side of the pixel unit) of the first substrate 110, and the turn-on/off of transistors of another group may be controlled by a test control signal supplied from a second test control line 165 disposed via a second side (e.g., a non-pixel region at the right side of the pixel unit) opposite to the first side of the first substrate 110.

That is, the first and second test control lines 164 and 165 are coupled to the pad portion 145 of the first substrate 110 via different sides of the panel. Each of the first and second test control lines 164 and 165 provides gate electrodes of the transistors M1 to M3m with a test control signal supplied via a pad coupled thereto.

A configuration of the tester 160 and a testing method of the organic light emitting display device using the tester 160 will be described in detail later.

Meanwhile, the pad portion 145 is formed at one side of the first substrate 110, and includes a plurality of pads P for coupling the panel to an external driving circuit. A portion of the non-pixel region adjacent to the pad portion 145 may be set as the IC mounting region 150. The IC mounting region 150 may also include pads for coupling signal lines and/or power lines formed on the first substrate 110 to an IC.

The encapsulation substrate 200 encapsulates one region of the first substrate 110 including the pixel unit 120. For example, the encapsulation substrate 200 may encapsulate a region including the pixel unit 120, the scan driver 140 and the tester 160 on the first substrate 110. However, the encapsulation substrate 200 is not disposed on the pad portion 145 so that one side of the first substrate 110 including the pad portion 145 is exposed. For example, the encapsulation substrate 200 may expose one side of the first substrate 110 including the pad portion 145 and the IC mounting region 150.

Meanwhile, in order to implement the flexible display device, the encapsulation substrate 200 is preferably formed of a flexible material. To this end, a thin film encapsulation (TFE) is performed using a thin film, so that it is possible to implement the encapsulation substrate 200 that effectively encapsulates the pixel unit 120.

The protective film 300 is attached to the upper portion of the encapsulation substrate 200 so as to more effectively protect the pixel unit 120 from external stimulus.

The protective film 300 is also disposed to expose the one side of the first substrate 110 including the pad portion 145 and the IC mounting region 150. In a case where the organic light emitting display device of the present invention is implemented as the flexible display device, the protective film 300 is preferably formed of a flexible material.

In a process of enabling the protective film 300 to expose the one side of the first substrate 110, one region of the protective film 300 positioned at one upper portion of the first substrate 110 is removed through a cutting process. In this case, a cutting process such as a super-cut process may be performed in order to effectively cut the thin film applied to the flexible display device. The super-cut process has an advantage in that the thin film can be precisely cut using a cutter blade, etc. However, a wire, etc. near a cut region may be damaged by a physical impact that may be applied in the super-cut process.

Accordingly, the present invention provides an organic light emitting display device and a testing method thereof, which can detect even a failure occurring in a cutting process of a protective film. The present invention can be achieved by dividing transistors included in a tester into a plurality of groups and allowing each group to receive a test control signal supplied through different test control lines disposed at different sides of a panel. Hereinafter, the organic light emitting display device and the testing method thereof will be described in detail with reference to FIG. 2.

Referring to FIG. 2, each of the transistors M1 to M3*m* is coupled between any one of the plurality of test signal lines 161, 162 and 163 and any one of the data lines D1 to D3*m*.

Here, the test control lines 161 and 162 and 163 are used to supply a test signal to the data lines D1 to D3*m* via the transistors M1 to M3*m*. For example, the test signal lines 161, 162 and 163 may include a first test signal line 161 for supplying a red test signal DC_R, a second test signal line 162 for supplying a green test signal DC_G and a third test signal line 163 for supplying a blue test signal DC_B. Transistors M1, M4, . . . , M3*m*-5 and M3*m*-2 coupled to the first test signal line 161 may be coupled to data lines D1, D4, . . . , D3*m*-5 and D3*m*-2 of red sub-pixels R. Transistors M2, M5, . . . , M3*m*-4 and M3*m*-1 coupled to the second test signal line 162 may be coupled to data lines D2, D5, . . . , D3*m*-4 and D3*m*-1 of green sub-pixels G. Transistors M3, M6, . . . , M3*m*-3 and M3*m* coupled to the third test signal line 163 may be coupled to data lines D3, D6, . . . , D3*m*-3 and D3*m* of blue sub-pixels B.

Here, the first to third test signal lines 161, 162 and 163 may be disposed via at least one side of the panel. For example, the first to third test signal lines 161, 162 and 163 may be disposed via the left or right side of the panel, or may be disposed at both the sides of the panel. However, the first to third test signal lines 161, 162 and 163 may be variously modified, and their detailed descriptions will be omitted.

Each of the transistors M1 to M3*m* is turned on when a test control signal TG is supplied to the gate electrode thereof, so as to supply a test signal supplied from the test signal lines 161, 162 and 163 to the data lines D1 to D3*m*.

In more detail, the transistors M1 to M3*m* are divided into at least two groups, so that the turn-on/off of transistors of each group are controlled by the test control line 164 or 165. Accordingly, the pixels 130 may be divided into first and second pixel groups. The pixels 130 of each pixel group may be coupled to a transistor group (G1 or G2) controlled by the first or second test control line 164 or 165. That is, gate electrodes of transistors coupled to the pixels 130 of the first pixel group G1 among the transistors M1 to M3*m* may be coupled to the first test control line 164, and gate electrodes of transistors coupled to the pixels 130 of the second pixel group G2 among the transistors M1 to M3*m* may be coupled to the second test control line 165.

For example, when assuming that the pixels 130 of the first pixel group are set as pixels 130 on an odd-numbered column, and the pixels 130 of the second pixel group are set as pixels 130 on an even-numbered column, transistors M1 to M3, M7 to M9, . . . , M3*m*-5 to M3*m*-3 coupled to the pixels 130 on the odd-numbered column may be classified into the first group G1 so that the gate electrodes of the transistors are coupled to the first test control line 164, and transistors M4 to M6, M10 to M12, . . . , M3*m*-2 to M3*m* coupled to the pixels 130 on the even-numbered column may be classified into the second group G2 so that the gate electrodes of the transistors are coupled to the second test control line 165.

Here, the first and second test control lines 164 and 165 are disposed via different sides of the panel, which are opposite to each other. For example, the first test control line 164 may be disposed via the left side of the panel so as to be coupled to the pad portion 145, and the second test control line 165 may be disposed via the right side of the panel so as to be coupled to the pad portion 145.

By using the tester 160, it is possible to detect even a failure occurring in the cutting process of the protective film 300.

Particularly, as a greater impact is applied to the left or right side of the panel due to the inequality of a force that may occur during the cutting process of the protective film 300, lower wires, etc. may be damaged. In a case where the wires positioned at one side of the panel are damaged, the pixels 130 are turned on/off by respectively supplying first and second test control signals TG_1 and TG_2 to the first and second test control lines 164 and 165 in a failure test performed using the tester 160 after the cutting process of the protective film 300. Accordingly, it is possible to detect the presence of a failure.

More specifically, in a case where the lower wires are damaged as a great impact is applied to the left side of the panel during the cutting process of the protective film 300, it is highly likely that the first test control line 164 may be damaged. Hence, in a case where the failure test is performed by respectively supplying the first test control signal TG_1 and the test signals DC_R, DC_G and DC_R to the first test control line 164 and the test signal lines 161, 162 and 163 after the cutting process of the protective film 300, the pixels are not normally turned on, so that it is possible to detect the presence of a failure.

In a case where the lower wires are damaged as a great impact is applied to the right side of the panel during the cutting process of the protective film 300, it is highly likely that the second test control line 165 may be damaged. Hence, in a case where the failure test is performed by respectively supplying the second test control signal TG_2 and the test signals DC_R, DC_G and DC_R to the second test control line 165 and the test signal lines 161, 162 and 163 after the cutting process of the protective film 300, the pixels are not normally turned on, so that it is possible to detect the presence of a failure.

In a case where the wires at both the sides of the panel are all damaged, the pixels are not normally turned on, and hence it is possible to detect the presence of a failure.

That is, according to the present invention, the plurality of the transistors M1 to M3*m* coupled to each of the data lines D1 to D3*m* are divided into at least two groups G1 and G2, and the transistors of the at least two groups G1 and G2 are driven by respectively receiving the first and second test control signals TG_1 and TG_2 supplied from the first and second test control lines 164 and 165 disposed via the different sides of the panel. Accordingly, it is possible to detect even a failure occurring at only any one side of the panel in the cutting process of the protective film 300.

Meanwhile, in a case where the first and second test control signals TG_1 and TG_2 are simultaneously supplied, the failure can be detected. Particularly, in a case where the first and second test control signals TG_1 and TG_2 are supplied at different times, it is possible to more easily detect the presence of a failure.

The present invention can be particularly usefully applied to the failure test of the flexible display device having the protective film 300, in which the TFE is performed.

Figure 3:
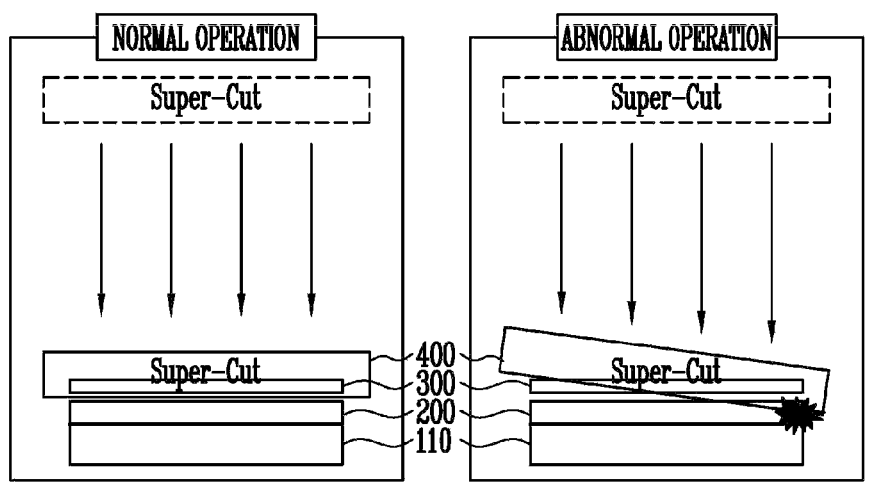
FIG. 3 is a side view schematically illustrating an example in which a failure occurs in a cutting process of a protective film.

FIG. 3 is a side view schematically illustrating an example in which a failure occurs in a cutting process of a protective film. Particularly, an example is disclosed in which the protective film is cut by a super-cut process.

Referring to FIG. 3, an encapsulation substrate 200 is disposed on a first substrate 110 so as to encapsulate a pixel unit, etc., and a protective film 300 is disposed on the encapsulation substrate 200. In this case, the protective film 300 should expose one side of the first substrate 110 including a pad portion (not shown). Therefore, one end of the protective film 300 is removed through the super-cut process in order to expose the one side of the first substrate 110.

In a case where the cutting process of the protective film 300 is normally performed, an equal force is applied to a cutter blade 400, and thus the protective film 300 is precisely cut. However, in a case where the cutting process of the protective film 300 is abnormally performed, i.e., in a case where a force is biased to one side of the cutter blade 400, wires disposed beneath the protective film 300, positioned at the side where a greater force is applied to the cutter blade 400, are disconnected, and therefore a failure easily occurs.

Although the cutting process of the protective film 300 is normally performed, the force is applied at the boundary between encapsulation and non-encapsulation regions by the cutter blade 400. Therefore, it is likely that a defect of the wires may occur in these regions.

Conventionally, it was difficult to detect a failure, and particularly, it was difficult to detect a failure when the failure occurs at one side of the panel. However, according to the present invention, the organic light emitting display device is designed so that the transistors of the tester are divided into at least two groups, and the transistors of each group are turned on/off by the first or second test control lines disposed via different sides of the panel. Accordingly, the transistors are driven by respectively supplying the first and second test control signals to the first and second test control lines after the cutting process of the protective film, so that it is possible to effectively detect even a failure occurring to the cutting process of the protective film.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display device, comprising: a first substrate on which a pixel unit and a tester are formed, wherein the pixel unit includes a plurality of pixels positioned at intersection portions of scan lines and data lines, the data lines being grouped as odd-numbered column data lines and even-numbered column data lines, and the tester includes a plurality of transistors coupled to the respective data lines so as to supply a test signal to the data lines, and wherein the transistors are divided into a first group connected directly to only the odd-numbered column data lines and a second group connected directly to only the even-numbered column data lines, gate electrodes of the transistors of the first group are turned being commonly connected to a first test control line, and gate electrodes of the transistors of the second group being commonly connected to a second test control line.

2. The organic light emitting display device according to claim 1, further comprising:
an encapsulation substrate that encapsulates one region of the first substrate including at least the pixel unit; and
a protective film attached to an upper portion of the encapsulation substrate.

3. The organic light emitting display device according to claim 1, wherein the pixels each include a plurality of sub-pixels, the sub-pixels including red, green and blue sub-pixels, and the test signal including red, green and blue test signals.

4. The organic light emitting display device according to claim 2, wherein the first substrate, the encapsulation substrate and the protective film are formed of a flexible material.

5. The organic light emitting display device according to claim 2, further comprising a pad portion coupled to an external driving circuit, the pad portion being provided at one side of the first substrate, and the encapsulation substrate and the protective film expose the one side of the first substrate including the pad portion.

6. The organic light emitting display device according to claim 5, wherein the first test control line is coupled from a first pad of the pad portion via a non-pixel region at a left side of the pixel unit to the transistors of the first group, and the second test control line is coupled from a second pad of the pad portion via a non-pixel region at a right side of the pixel unit to the transistors of the second group, the pixel unit being disposed between the tester and the pad portion.

7. The organic light emitting display device according to claim 6, wherein the first pad is disposed at a first distal end of the pad portion and the second pad is disposed at a second distal end of the pad portion.

8. The organic light emitting display device according to claim 7, further comprising an integrated circuit mounting region disposed the exposed one side of the first substrate.

9. A testing method for detecting a failure of an organic light emitting display device having a pixel unit including a plurality of pixels positioned at intersection portions of scan lines and data lines, the data lines being grouped as odd-numbered column data lines and even-numbered column data lines, the method comprising:
supplying a first test control signal to a first group of transistors of a test unit;
supplying a second test control signal to a second group of transistors of a test unit;
the first group of transistors being connected directly to only the odd-numbered column data lines, the pixels of the odd-numbered column data lines being turned on in a first time period in response to test signals supplied by the first group of transistors in response to the first test control signal; and
the second group of transistors being connected directly to only the even-numbered column data lines, the pixels of the even-numbered column data lines being turned on in a second time period in response to test signals supplied by the second group of transistors in response to the second test control signal, the second time period different from the first time period.

10. The method as set forth in claim 9, wherein the pixels each include a plurality of sub-pixels, the sub-pixels including red, green and blue sub-pixels, and the test signals including red, green and blue test signals, the method further comprising:
turning on the red sub-pixels in response to the red test signals;
turning on the green sub-pixels in response to the green test signals; and
turning on the blue sub-pixels in response to the blue test signals.

* * * * *